United States Patent
Chang et al.

(10) Patent No.: US 11,552,219 B2
(45) Date of Patent: Jan. 10, 2023

(54) LED DISPLAY SCREEN MODULE

(71) Applicant: HARVATEK CORPORATION, Hsinchu (TW)

(72) Inventors: Jen-Hung Chang, Hsinchu (TW); Feng-Hui Chuang, New Taipei (TW)

(73) Assignee: HARVATEK CORPORATION, Hsinchu (TW)

( * ) Notice: Subject to any disclaimer, the term of this patent is extended or adjusted under 35 U.S.C. 154(b) by 0 days.

(21) Appl. No.: 16/927,060

(22) Filed: Jul. 13, 2020

(65) Prior Publication Data
US 2021/0328111 A1    Oct. 21, 2021

(30) Foreign Application Priority Data
Apr. 15, 2020   (TW) .................................. 109112591

(51) Int. Cl.
*H01L 33/48*   (2010.01)
*H01L 27/15*   (2006.01)

(52) U.S. Cl.
CPC .......... *H01L 33/486* (2013.01); *H01L 27/156* (2013.01)

(58) Field of Classification Search
CPC .......... H01L 27/156; H01L 33/48–486; H01L 2933/0033; H01L 25/167; H01L 33/0095; H01L 33/504; H01L 33/58; H01L 2933/0058; H01L 2933/0091; H01L 25/0753; G09F 9/33; G09F 9/3026
See application file for complete search history.

(56) References Cited

U.S. PATENT DOCUMENTS

| | | | |
|---|---|---|---|
| 9,685,428 B2 | 6/2017 | Chang | |
| 2006/0093809 A1* | 5/2006 | Hebrink | B32B 27/14 428/323 |
| 2008/0160658 A1* | 7/2008 | Wang | H01L 21/565 257/E23.116 |
| 2011/0050071 A1* | 3/2011 | Chung | F21K 9/00 313/46 |
| 2014/0159084 A1* | 6/2014 | Castillo | H01L 33/58 438/27 |

(Continued)

FOREIGN PATENT DOCUMENTS

| CN | 101052902 A | 10/2007 |
|---|---|---|
| CN | 104952372 A | 9/2015 |

(Continued)

*Primary Examiner* — Jonathan Han
(74) *Attorney, Agent, or Firm* — Li & Cai Intellectual Property (USA) Office

(57) ABSTRACT

An LED display screen module includes a module substrate and a plurality of LED package structures. The LED package structures are disposed on the module substrate and arranged into an array. Each of the LED package structures includes a plurality of pixels and a packaging layer. The pixels are spaced apart from each other. The packaging layer includes a plurality of packaging portions and a plurality of connecting portions. The packaging portions respectively cover the pixels, and each of the connecting portions is connected between the adjacent two packaging portions. Each of the packaging portions has an upper light emitting surface and a lateral light emitting surface. The upper light emitting surface is a flat surface and is connected to the lateral light emitting surface via a transitional curved surface.

9 Claims, 4 Drawing Sheets

(56) References Cited

U.S. PATENT DOCUMENTS

| | | | |
|---|---|---|---|
| 2015/0282265 A1 | 10/2015 | Wei | |
| 2017/0040299 A1* | 2/2017 | Chang | ................. H01L 25/0753 |
| 2018/0005999 A1 | 1/2018 | Pang et al. | |
| 2019/0044040 A1 | 2/2019 | Andrews | |
| 2020/0135992 A1* | 4/2020 | Kikuchi | ................. H01L 33/58 |

FOREIGN PATENT DOCUMENTS

| | | |
|---|---|---|
| CN | 204991702 U | 1/2016 |
| JP | 2007264201 A | 10/2007 |

* cited by examiner

LED DISPLAY SCREEN MODULE

CROSS-REFERENCE TO RELATED PATENT APPLICATION

This application claims the benefit of priority to Taiwan Patent Application No. 109112591, filed on Apr. 15, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a display screen module, and more particularly to a multi-pixel LED display screen module.

BACKGROUND OF THE DISCLOSURE

Light emitting diodes (LEDs) have the advantages of small size, high luminous efficiency, low energy consumption and being environment-friendly, and can produce lights in various colors. Therefore, the LEDs have good application prospects in display devices. The conventional LED display screens use red, green and blue LED chip together in a single pixel package to provide a better display effect. However, with the resolution of the LED display screens becoming higher and higher, a smaller package volume is required to allow a number of pixels to be closer to each other. As a result, external electrodes of the red, green and blue LED chip would be densely arranged, which requires a relatively complicated circuit design, and thus the overall production difficulty and production cost are relatively increased.

In order to solve the above-mentioned problems, an approach developed by the industry is to arrange a number of pixels in a single package to reduce gaps between the pixels. However, lights transmitted in the package can be prevented from being disturbed by the external environment. As a result, the optical crosstalk may easily occur between the adjacent two pixels, affecting the color performance of a display. For effectively separating the pixels, a common manner is to form at least one recess on the package by cutting. However, more than two cutting actions may be used to form a recess. For example, if a cutter is provided with a maximum cutting width of 1.0 mm, a cutting action with a cutting width of 1.0 mm and a cutting action with a cutting width of 0.4 mm are required for forming a recess with a width of 1.4 mm. As a result, the cutter would not only sustain more damage, but the manufacturing process would also become more complicated.

SUMMARY OF THE DISCLOSURE

In response to the above-referenced technical inadequacies, the present disclosure provides an LED display screen module with high display quality.

In one aspect, the present disclosure provides an LED display screen module, which includes a module substrate and a plurality of LED package structures. The LED package structures are disposed on the module substrate and arranged into an array. Each of the LED package structures includes a plurality of pixels and a packaging layer. The pixels are spaced apart from each other and each thereof includes a plurality of LED chips. The packaging layer includes a plurality of packaging portions and a plurality of connecting portions. The packaging portions respectively cover the pixels, and each of the connecting portions is connected between the adjacent two packaging portions. Each of the packaging portions has an upper light emitting surface and a lateral light emitting surface. The upper light emitting surface is a flat surface and is connected to the lateral light emitting surface via a transitional curved surface.

In certain embodiments, a thickness of each of the connecting portions is less than a height of at least one of the LED chips.

In certain embodiments, the thickness of each of the connecting portions is less than 100 μm.

In certain embodiments, the transitional curved surface has a curvature radius between 0.01 mm and 0.1 mm.

In certain embodiments, the transitional curved surface has a surface roughness Ra greater than 0 μm and less than 5 μm.

In certain embodiments, each of the pixels defines a reference surface that passes through the corresponding LED chips and is perpendicular to the module substrate. The corresponding packaging portion has a structure that is left-right symmetric with respect to the reference surface.

In certain embodiments, the adjacent two packaging portions are left-right symmetric with respect to the corresponding connecting portion.

In certain embodiments, the LED chips of each of the pixels are respectively a first LED chip having a light emission wavelength between 605 nm and 650 nm, a second LED chip having a light emission wavelength between 510 nm and 545 nm, and a third LED chip having a light emission wavelength between 450 nm and 485 nm.

In certain embodiments, the pixels of each of the LED package structures are arranged into an array. The LED chips of each of the pixels are respectively a first LED chip, a second LED chip and a third LED chip, which have different colors and are arranged apart along a row or column direction of the array. The first, second or third LED chips of the adjacent two pixels of each of the LED package structures has a first inner gap. The first, second or third LED chips of the most adjacent two pixels of the adjacent two LED package structures has a first outer gap that is equal to the first inner gap.

In certain embodiments, the adjacent two LED package structures have a second outer gap that is equal to a width of each of the connecting portions.

One of the effects of the present disclosure is that, the LED display screen module has an increase in color consistency and brightness uniformity so as to display an image with good visual effects by the technical features of "the packaging portions of the packaging layer respectively cover the pixels, and each thereof has an upper light emitting surface and a lateral light emitting surface" and "the upper light emitting surface is a flat surface and is connected to the lateral light emitting surface via a transitional curved surface". In use, a number of the LED display screen module can be spliced together by mechanical members to form a larger-sized display screen.

In addition, the LED display screen module can be obtained by a simple manufacturing process and be easy to operate and control, and the resulting products have stable quality and can be produced in large scale.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
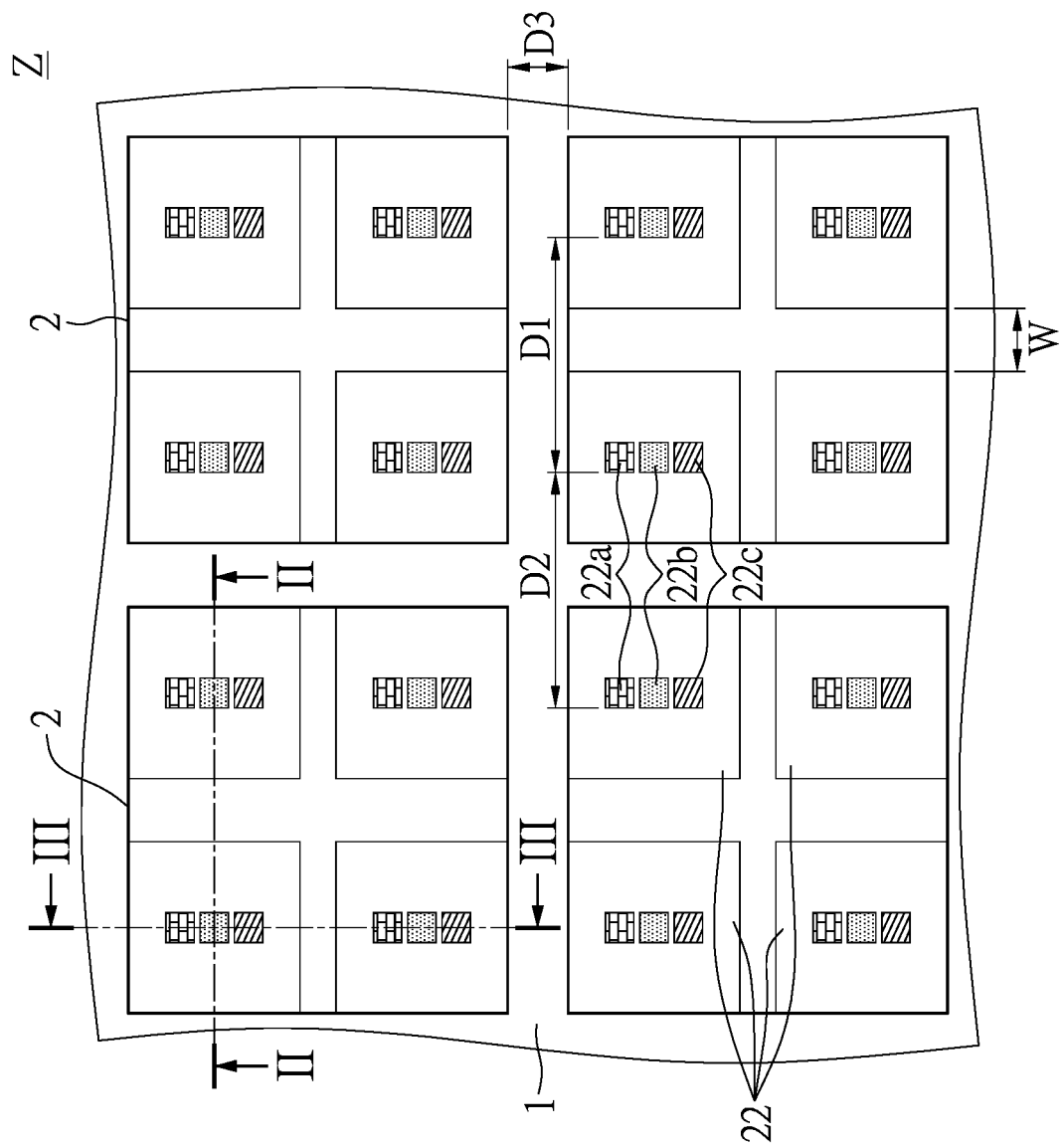
FIG. 1 is a top view of an LED display screen module of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
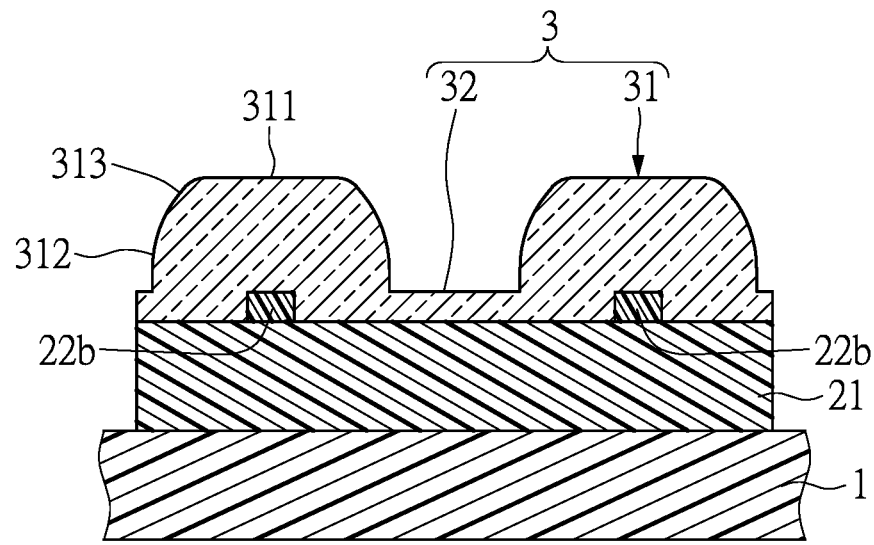
FIG. 2 is a sectional view taken along line II-II of FIG. 1.
Figure 3:
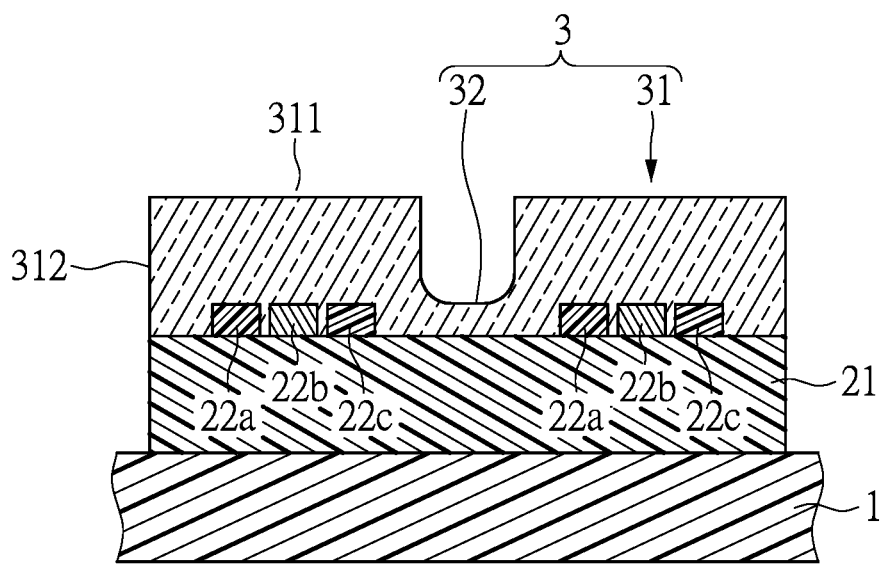
FIG. 3 is a sectional view taken along line III-III of FIG. 1.

Referring to FIG. 1 to FIG. 3, an embodiment of the present disclosure provides an LED display screen module Z (also referred to as "light board module"), which includes a module substrate 1 and a plurality of LED package structures 2. The LED package structures 2 are disposed on the module substrate 1 and arranged into an array. The module substrate 1 can be a circuit board that has a signal transmission circuit and a plurality of connecting interfaces (e.g. outer conductive pads), but the present disclosure is not limited thereto.

More specifically, each of the LED package structures 2 includes a package substrate 21, a plurality of pixels 22 and a packaging layer 23. The pixels 22 are disposed on the package substrate 21 and spaced apart from each other, and preferably arranged into an array. Each of the pixels 22 includes a plurality of LED chips. The packaging layer 3 includes a plurality of packaging portions 31 and a plurality of connecting portions 32. The packaging portions 31 respectively cover the pixels 22, and each of the packaging portions 31 has an upper light emitting surface 311 and a lateral light emitting surface 312. Each of the connecting portions 32 is connected between the adjacent two packaging portions 31. It is worth mentioning that, the packaging layer 3 is formed by compression molding, such that the upper light emitting surface 311 is a flat surface and is connected to the lateral light emitting surface 312 via a transitional curved surface 313. As shown in FIG. 2, in consideration of display effects and manufacturing processes, the curvature radius of the transitional curved surface 313 is preferably between 0.01 mm and 0.1 mm. The surface roughness Ra of the transitional curved surface 313 is greater than 0 μm and less than 5 μm, and preferably greater than 0 μm and less than 2 μm.

Although FIG. 1 shows that each of the LED package structures 2 includes four pixels 22 arranged into a 2×2 pixel array, the number and arrangement of the pixels 22 can be changed according to actual requirements, for example, the standard resolution (SD, 720×480 pixels), high resolution (HD, 1280×720 pixels), full high resolution (Full HD, 1920×1080 pixels) or 4K resolution (3840×2160 pixels or 4096×2160 pixels).

In practice, the package substrate 21 can be an insulating substrate with a plurality of connecting interfaces (e.g., outer conductive pads) and a plurality of signal transmission interfaces (e.g., inner conductive pads) formed thereon. The LED chips of each of the pixels 22 are respectively a first LED chip 22a, a second LED chip 22b and a third LED chip 22c, which have different colors and can be arranged along a row or column direction of the pixel array. The first LED chip 22a, the second LED chip 22b and the third LED chip 22c are respectively configured to emit red, green and blue lights, but the present disclosure is not limited thereto. The first LED chip 22a, the second LED chip 22b and the third LED chip 22c can be electrically connected to the connecting interfaces of the package substrate 21 via wires. In order to stabilize the connections of the wires, one ends of the wires are soldered on the package substrate 21 and then the other ends of the wires are soldered on electrodes of the LED chips. The packaging layer 3 can be formed from transparent polymer materials with low water vapor and oxygen permeability such as epoxy resin and silicone resin to provide protection to the LED chips, thereby ensuring the normal operation of the LED chips.

In the present embodiment, the light emission wavelength of the first LED chip 22a can be between 605 nm and 650 nm. The first LED chip 22a can be a red LED chip, or can include a blue LED chip and a wavelength converting layer formed on the blue LED chip, in which the wavelength converting layer can have a red phosphor. The light emission wavelength of the second LED chip 22*b* can be between 510 nm and 545 nm. The second LED chip 22*b* can be a green LED chip, or can include a blue LED chip and a wavelength converting layer formed on the blue LED chip, in which the wavelength converting layer can have a green phosphor. The light emission wavelength of the third LED chip 22*c* can be between 450 nm and 485 nm. The third LED chip 22*c* can be a blue LED chip. However, these examples are not meant to limit the scope of the present disclosure. The light colors and implementation manners of the LED chips can be changed by persons skilled in the art.

Reference is now made to FIG. 2 and FIG. 3. In order to reduce or avoid the optical crosstalk between the pixels 22, the thickness of each of the connecting portions 32 is less than the height of at least one of the corresponding LED chips, and preferably less than the heights of the corresponding LED chips. Accordingly, lights emitted from the LED chips of one of the pixels 22 cannot be transmitted to another adjacent one of the pixels 22 via the same medium. For this purpose, the thickness of each of the connecting portions 32 is less than 100 μm. In certain embodiments, the thickness of each of the connecting portions 32 can be 10 μm, 20 μm, 30 μm, 40 μm, 50 μm, 60 μm, 70 μm, 80 μm or 90 μm.

Furthermore, each of the pixels 22 defines a reference surface that passes through the corresponding LED chips and is perpendicular to the module substrate 21, and the corresponding packaging portion 31 has a structure that is left-right symmetric with respect to the reference surface. Accordingly, the total internal reflection of lights within each of the pixels 22 can be reduced or avoided to increase color consistency and color expression ability. In addition, in order to increase brightness uniformity, the adjacent two packaging portions 31 are left-right symmetric with respect to the corresponding connecting portion 32.

Reference is now made to FIG. 1. In certain embodiments, the first, second or third LED chips 22*a*, 22*b*, 22*c* of the adjacent two pixels 22 of each of the LED package structures 2 has a first inner gap D1, and the first, second or third LED chips 22*a*, 22*b*, 22*c* of the most adjacent two pixels 22 of the adjacent two LED package structures 2 has a first outer gap D2. The first inner gap D1 is equal to the first outer gap D2, which is between 0.5 μm and 1.25 μm. In certain embodiments, the adjacent two LED package structures 2 has a second outer gap D3 that is substantially equal to a width W of each of the connecting portions 32. Accordingly, the resolution of a display can be increased, and more realistic images can be displayed.

Figure 4:
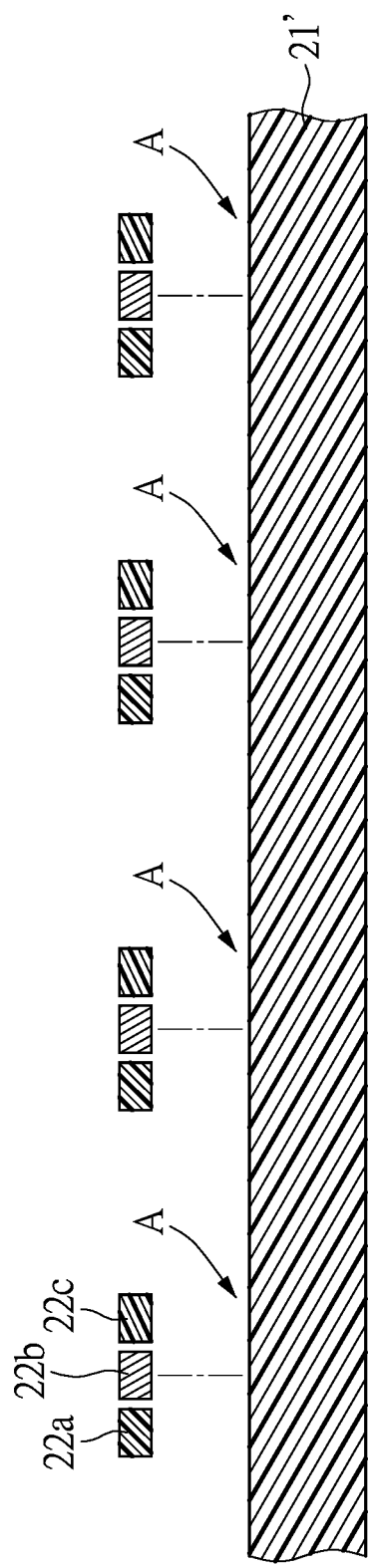
FIG. 4 is a schematic view showing the LED display screen module of the present disclosure in a manufacturing step.
Figure 5:
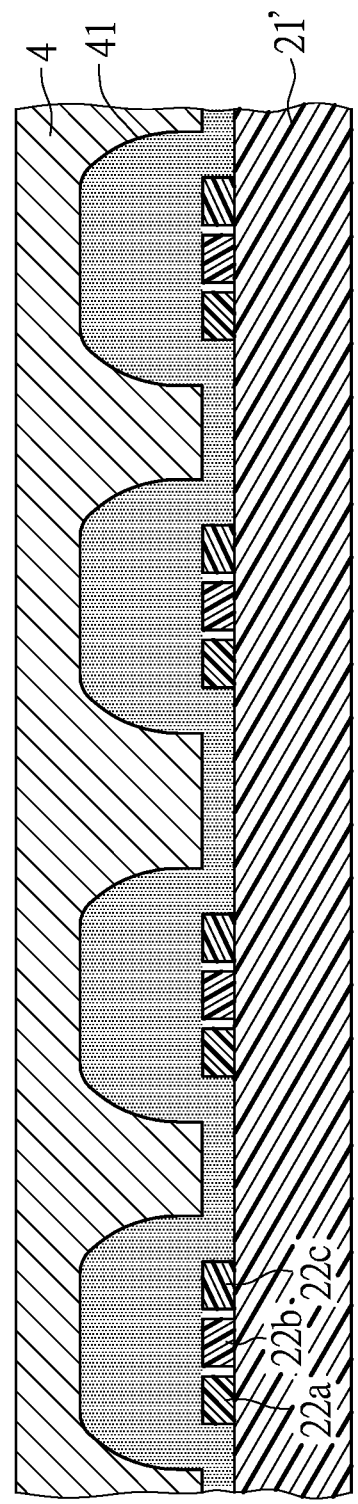
FIG. 5 is a schematic view showing the LED display screen module of the present disclosure in another manufacturing step.
Figure 6:
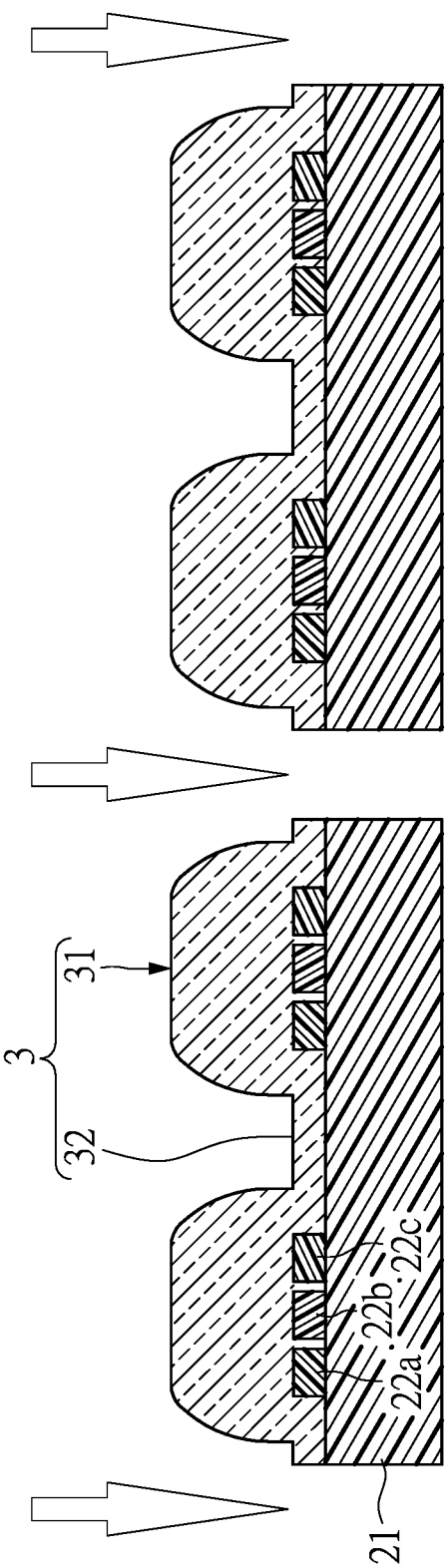
FIG. 6 is a schematic view showing the LED display screen module of the present disclosure in still another manufacturing step.

Reference is now made to FIG. 4 to FIG. 6, the LED display screen module Z can be manufactured by the following steps. Firstly, an initial package substrate 21' is provided, which has a plurality of chip mounting areas A. Next, a first LED chip 22*a*, a second LED chip 22*b* and a third LED chip 22*c* are disposed on each of the chip mounting areas A. Next, a compressing mold 4 is placed on the initial package substrate 21', and a transparent polymer material with low water vapor and oxygen permeability is melted and filled into mold cavities 41 for shaping. The mold cavities 41 correspond in position to the chip mounting areas A. Next, the transparent polymer material is cured into an initial packaging layer 3' that includes a plurality of packaging portions 31. Each of the packaging portions 31 has an upper light emitting surface 311, a lateral light emitting surface 312 and a transitional curved surface 313 connected between the upper light emitting surface 311 and the lateral light emitting surface 312. The adjacent two packaging portions 31 have a connecting portion 32 with a thickness less than 100 μm. Next, the initial package substrate 21' is cut along cutting lines that are located in spaces between the chip mounting areas A in advance, so as to form a plurality of LED package structures 2 spaced apart from each other. Finally, the LED package structures 2 are disposed on a module substrate 1 and arranged into an array.

One of the advantageous effects of the present disclosure is that, the LED display screen module has an increase in color consistency and brightness uniformity so as to display an image with good visual effects by the technical features of "the packaging portions of the packaging layer respectively cover the pixels, and each of the packaging portions has an upper light emitting surface and a lateral light emitting surface" and "the upper light emitting surface is a flat surface and is connected to the lateral light emitting surface via a transitional curved surface". In use, a number of the LED display screen module can be spliced together by mechanical members to form a larger-sized display screen.

Further, each of the connecting portions of the packaging layer has a thickness less than a height of at least one of the corresponding LED chips, and preferably less than 100 μm. Accordingly, the optical crosstalk between the pixels can be reduced or avoided. Each of the packaging portions of the packaging layer has a transitional curved surface with a curvature radius between 0.01 mm and 0.1 mm, so as to have a draft angle from 3 degrees to 5 degrees. Accordingly, the mold release efficiency of a compression mold can be increased. Furthermore, the transitional curved surface of each of the connecting portions has a surface roughness Ra greater than 0 μm and less than 5 μm, preferably greater than 0 μm and less than 2 μm, such that the color resolution of the pixels can be increased.

In addition, the LED display screen module of the present disclosure can be obtained by a simple manufacturing process and be easy to operate and control, and the resulting products have stable quality and can be produced in large scale.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An LED display screen module, comprising:
  a module substrate; and
  a plurality of LED package structures being disposed on the module substrate and arranged into an array, wherein each of the LED package structures includes:
    a plurality of pixels being spaced apart from each other and each including a plurality of LED chips; and
    a packaging layer including a plurality of packaging portions and a plurality of connecting portions, the packaging portions respectively covering the pixels, each of the connecting portions being connected between the adjacent two packaging portions and having a thickness of less than 100 μm, wherein each of the packaging portions has an upper light emitting surface and a lateral light emitting surface, and the upper light emitting surface is a flat surface and is connected to the lateral light emitting surface via a transitional curved surface.

2. The LED display screen module according to claim 1, wherein a thickness of each of the connecting portions is less than a height of at least one of the LED chips.

3. The LED display screen module according to claim 1, wherein the transitional curved surface has a curvature radius between 0.01 mm and 0.1 mm.

4. The LED display screen module according to claim 1, wherein the transitional curved surface has a surface roughness Ra greater than 0 μm and less than 5 μm.

5. The LED display screen module according to claim 1, wherein each of the pixels defines a reference surface that passes through the corresponding LED chips and is perpendicular to the module substrate, and the corresponding packaging portion has a structure that is left-right symmetric with respect to the reference surface.

6. The LED display screen module according to claim 5, wherein the adjacent two packaging portions are left-right symmetric with respect to the corresponding connecting portion.

7. The LED display screen module according to claim 1, wherein the LED chips are respectively a first LED chip having a light emission wavelength between 605 nm and 650 nm, a second LED chip having a light emission wavelength between 510 nm and 545 nm, and a third LED chip having a light emission wavelength between 450 nm and 485 nm.

8. The LED display screen module according to claim 1, wherein the pixels of each of the LED package structures are arranged into an array, and the LED chips of each of the pixels are respectively a first LED chip, a second LED chip and a third LED chip, which have different colors and are arranged apart along a row or column direction of the array; the first, second or third LED chips of the adjacent two pixels of each of the LED package structures has a first inner gap; and the first, second or third LED chips of the most adjacent two pixels of the adjacent two LED package structures has a first outer gap that is equal to the first inner gap.

9. The LED display screen module according to claim 1, wherein the adjacent two LED package structures has a second outer gap that is equal to a width of each of the connecting portions.

* * * * *